June 2, 1964 H. H. LENK 3,135,921
SELF-QUENCHED SUPERREGENERATIVE CIRCUIT UTILIZING VARIABLE IMPEDANCE DIODE IN QUENCHING CIRCUIT
Filed May 1, 1962
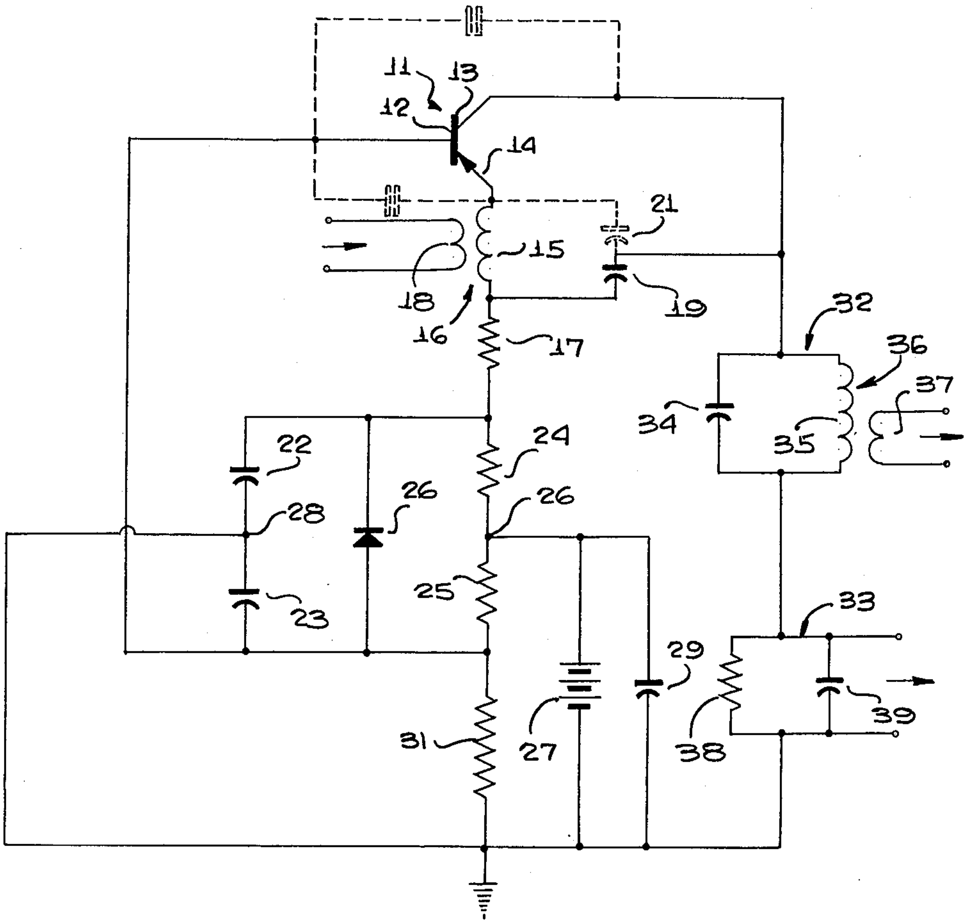
INVENTOR
HERBERT H. LENK
BY Hurvitz & Rose
ATTORNEYS United States Patent Office 3,135,921

Patented June 2, 1964

3,135,921

SELF-QUENCHED SUPER-REGENERATIVE CIRCUIT UTILIZING VARIABLE IMPEDANCE DIODE IN QUENCHING CIRCUIT

Herbert H. Leak, Cincinnati, Ohio, assignor to Avco Corporation, Cincinnati, Ohio, a corporation of Delaware Filed May 1, 1962, Ser. No. 191,550
9 Claims. (Cl. 325—429)

The present invention relates to a super-regenerative circuit and more particularly to a super-regenerative circuit having a self quenching network including an automatically controlled, variable impedance.

The need presently exists for a very high frequency amplifier and detector circuit having self regulating or automatic power gain characteristics. The circuit must maintain a relatively uniform power output for variable input signal levels, must not overload destructively with excess input signal, and must exhibit good voltage and power gain characteristics in the normal amplifier range.

These attributes are provided by the circuit of the present invention which employs a super-regenerative, self quenching stage. The self quenching circuit includes a variable impedance for discharging a bias capacitor at a rate inversely related to the amplitude of the super-regenerative oscillations. The self quenching circuit is connected in the emitter to base circuit of a super-regenerative transistor circuit. The super-regenerative stage is utilized as an amplifier and/or detector by employing a tuned filter and a low pass filter in the transistor collector circuit.

The variable impedance includes a diode having one of its electrodes connected to a point of relatively constant potential. The other electrode is connected to a point of potential which varies above or below the fixed potential depending on the magnitude of the oscillatory current in the transistor emitter-collector circuit. For large currents, the diode is forward biased and discharges the capacitor at a high rate so that the quench action quickly occurs. For small currents, the diode is back biased so that the capacitor is discharged at a slow rate through a resistance circuit external to the diode, thereby retarding quench action. Since the quench varies inversely with transistor conduction, and hence input signal level, the power output is maintained substantially constant for varying input signal levels.

Accordingly it is an object of the present invention to provide a new and improved self quenching, super-regenerative circuit.

Another object is to provide a self quenching super-regenerative circuit having a substantially constant, high power output for variable level input signals.

A further object is to provide a new and improved self quenching super-regenerative circuit having automatic power gain control for variable level input signals.

Still another object is to provide a new and improved self quenching super-regenerative circuit which may be utilized for signal amplification and demodulation.

Yet a further object of the present invention is to provide a new and improved super-regenerative, self quenching, high efficiency power amplifier.

A still further object of the present invention is to provide a new and improved super-regenerative, self quenching circuit with overload protection against destructive power inputs.

An additional object of the present invention is to provide a super-regenerative circuit which self quenches faster for large signal levels than for small signal levels by its use of a signal responsive variable impedance in the quench circuit.

The above and still further objects, features and advantages of the present invention will become apparent upon consideration of the following detailed description of one specific embodiment thereof, especially when taken in conjunction with the accompanying drawings, wherein the single figure is a schematic diagram of a preferred embodiment of the invention.

Reference is now made to the figure which discloses a PNP transistor 11 connected in the common emitter mode and includes base electrode 12, emitter electrode 13 and collector electrode 14. One end of secondary winding 15 of transformer 16 is connected to emitter 14, while the other end of winding 15 is connected to current limiting resistor 17. The primary winding 18 of transformer 16 is responsive to a radio-frequency signal having a V.H.F. carrier frequency equal to the frequency at which the circuit is designed to operate. A low Q positive feedback circuit for establishing the oscillations in the circuit is established by the capacitive voltage divider including capacitor 19, the collector to emitter inter-electrode capacity 21 and coil 15. The feedback circuit is selected to have a low Q to enable input signals having fairly large frequency bands to be amplified substantially the same. Also by using a low Q, greater coupling of the generated oscillations to the self quenching circuit (described infra) is achieved. The relative values of capacities 19 and 21, which are coupled between collector 13 and the opposite ends of coil 15, are determined by the known Barkhausen criteria to insure sustained oscillatory currents in transistor 11.

Connected between current limiting resistor 17 and base 12 is a self quenching circuit including a pair of tapped biasing capacitors 22 and 23 and a pair of tapped resistors 24 and 25, both the tapped resistors and capacitors being connected in parallel with each other and diode 26. Diode 26 is connected so that its cathode forms a junction with capacitor 22 and resistor 24, and its anode forms a junction with capacitor 23 and resistor 25.

The tap 26 between resistors 24 and 25 is connected to the positive terminal of battery 27 while the tap 28 between capacitors 22 and 23 is connected to the negative battery terminal or ground. Battery 27 is shunted by capacitor 29 to maintain the proper power supply regulation for sudden, large amplitude current demands of the system. Connected between the anode of diode 26 and ground is resistor 31 to maintain the anode at a fairly constant voltage, normally less than the cathode. The anode of diode 26 is also connected to the base 12 of transistor 13 to complete the base to emitter circuit. When the circuit is in oscillation a positive feedback path exists between the collector and base of transistor 11 through capacitor 19 and capacitors 22 and 23, the latter two capacitors being substantially short circuits for the frequency of oscillation.

Connected in series between the collector 13 of transistor 11 and ground are tuned load circuit 32 and low pass filter 33. Circuit 32 is a high Q tank circuit, tuned to the same frequency as the input carrier and the circuit oscillatory frequency, and includes capacitor 34, connected in parallel with the primary winding 35 of transformer 36. Secondary winding 37 of transformer 36 couples an amplified signal which is a replica of the input signal to an external R.F. load, not shown. The tuned primary winding 36 serves as a high impedance filter and source for the oscillatory feedback currents from collector 13 to the input electrodes 12 and 14. Efficiency of the stage is maintained at a high level because power supply 27 gates power directly to tuned load circuit 32. Filter 33 includes the parallel combination of resistor 38 and capacitor 39. These components are selected so that only the detected signal, i.e. the low frequency variations of the carrier input, are fed to an external load connected across capacitor 39.

The operation of the circuit will now be described by assuming that a low amplitude independent signal or noise is coupled to primary winding 18 and that transistor 11 has just begun to conduct. Conduction of transistor 11 results in the flow of positive current pulses from base 12 through capacitors 22 and 23 to emitter 14. In response to these pulses capacitors 22 and 23 are charged to bias base 12 positive relative to emitter 14. Eventually the charge across capacitors 22 and 23 is sufficient to materially reduce the flow of current through the emitter-collector and emitter-base circuits of transistor 11. When this occurs capacitors 22 and 23 discharge through resistors 24 and 25. With low level input signals the anode of diode 26 is maintained negative with respect to its cathode due to the small emitter to collector current flowing through resistor 24 relative to the current flow through resistor 25. In consequence, diode 26 is back biased and serves as a high impedance for the discharging current so that the discharge time constant of capacitors 22 and 23 is relatively long. The relatively long discharge time constant results in a long duration quench of the oscillatory currents. When capacitors 22 and 23 have discharged sufficiently, the transistor is again rendered conductive and the cycle is re-initiated.

When the input signal increases, a greater emitter to collector current flows, resulting in forward biasing of diode 26 and greater charge accumulation across capacitor 22 due to the increased current in resistor 24. When the quench portion of the cycle occurs, capacitors 22 and 23 now quickly discharge through the low forward impedance of diode 26. Accordingly the quench is quickly extinguished. It will be seen that diode 26 and resistors 24 and 25 serve as a variable impedance having a value dependent on the amplitude of the oscillatory current flow through transistor 11.

Since quench time varies inversely with input signal amplitude, the output power of each cycle remains fairly constant regardless of input signal level. Protection against transistor burn out in response to very large amplitude input signals is provided by the resulting large positive base bias quickly established by capacitors 22 and 23.

While I have described and illustrated one specific embodiment of my invention, it will be clear that variations of the details of construction which are specifically illustrated and described may be resorted to without departing from the true spirit and scope of the invention as defined in the appended claims.

I claim:

1. A super-regenerative circuit with self quenching comprising amplifying means having a first electrode for emitting charged carriers, a control electrode and an output electrode, a positive feedback circuit coupled between at least two of said electrodes for establishing an oscillatory current in said means, and a self quenching circuit coupled between said first and control electrodes, said quenching circuit including reactive impedance means, a variable impedance including a diode and responsive in value to the amplitude of said current for discharging said reactive impedance means, and means for back-biasing said diode for small input signals.

2. A super-regenerative circuit with self quenching comprising a transistor having a base electrode, a collector electrode and an emitter electrode, a positive feedback circuit coupled between at least two of said electrodes for establishing an oscillating current in said transistor, means for coupling an independent signal to said feedback circuit, a self quenching circuit coupled between said emitter and base, said self quenching circuit including capacitor means coupled in parallel with a voltage-sensitive variable resistance having a value responsive to the amplitude of said current, and means for back-biasing said resistance for small input signals.

3. A super-regenerative amplifier with self quenching comprising a transistor having a base electrode, a collector electrode and an emitter electrode, a positive feedback circuit coupled between at least two of said electrodes for establishing an oscillating current of predetermined frequency in said transistor, means for coupling an independent signal having a frequency approximately equal to said predetermined frequency to said feedback circuit, a self quenching circuit coupled between said emitter and base, said self quenching circuit including capacitor means coupled in parallel with a voltage-sensitive variable resistance having a value responsive to the amplitude of said current, means for back-biasing said resistance for small input signals, and an output circuit connected to said collector electrode and including a circuit tuned to said frequency.

4. A super-regenerative detector with self quenching comprising a transistor having a base electrode, a collector electrode and an emitter electrode, a positive feedback circuit coupled between at least two of said electrodes for establishing an oscillating current of predetermined frequency in said transistor, means for coupling an independent amplitude modulated signal having a carrier frequency approximately equal to said frequency to said feedback circuit, a self quenching circuit coupled between said emitter and base, said self quenching circuit including capacitor means coupled in parallel with a variable voltage-sensitive resistance having a value responsive to the amplitude of said current, means for back-biasing said resistance for small input signals, and an output circuit connected to said collector electrode including means for deriving a signal having frequency components only in the same band as the modulations of said independent signal.

5. A super-regenerative circuit with self quenching comprising a transistor having base, collector, and emitter electrodes, a positive feedback circuit coupled between at least two of said electrodes for establishing oscillatory currents of predetermined frequency in said transistor, a self quenching circuit coupled between said emitter and base electrodes and including capacitor means coupled in parallel with a variable resistance having a value controlled by the amplitude of said current, said feedback circuit comprising a coil connected in series circuit with said quenching circuit, and capacitor voltage divider means coupled to both ends of said coil and to said collector electrode.

6. The circuit of claim 5 further comprising a transformer for coupling an independent signal having a frequency approximately equal to said predetermined frequency to said feedback circuit, said coil being the secondary winding of said transformer.

7. A super-regenerative circuit with self quenching comprising a transistor having base, collector, and emitter electrodes, a positive feedback circuit coupled between at least two of said electrodes for establishing oscillatory currents of predetermined frequency in said transistor, a self quenching circuit coupled between said emitter and base electrodes, said self quenching circuit comprising a diode connected in parallel with a resistance having a tapping point and in parallel with a capacity having a tapping point, and means for applying a bias between said tapping points.

8. A super-regenerative circuit with self quenching comprising amplifying means having a first electrode for emitting charged carriers, a control electrode and an output electrode, means coupled to at least two of said electrodes for establishing an oscillatory current in said amplifying means, a self quenching circuit coupled between said first and control electrodes, said self quenching circuit including a reactive impedance and a voltage-sensitive variable impedance having a value dependent on the amplitude of said current for discharging said reactive impedance, and means for back-biasing said voltage-sensitive impedance for small input signals.

9. A super-regenerative circuit with self quenching comprising amplifying means having a first electrode for emitting charged carriers, a control electrode and an output electrode, a positive feedback circuit coupled between at least two of said electrodes for establishing an oscillatory current in said means, and a self quenching circuit coupled between said first and control electrodes, said quenching circuit including capacitor means coupled in parallel with a voltage responsive variable impedance for discharging said capacitor, said impedance being resistive and decreasing in value in response to larger amplitude currents in said means, said impedance comprising a diode connected in parallel with a resistance having a pair of end terminals and a tapping point, and means for biasing said point relative to said terminals.

References Cited in the file of this patent

UNITED STATES PATENTS

| | | |
|---|---|---|
| 2,576,642 | Richman | Nov. 27, 1951 |
| 2,577,782 | Loughlin | Dec. 11, 1951 |
| 2,851,685 | Hollman | Sept. 9, 1958 |
| 2,992,327 | Lennon et al. | July 11, 1961 |
| 3,025,394 | Durkee | Mar. 13, 1962 |